United States Patent
Park et al.

(10) Patent No.: US 10,481,493 B2
(45) Date of Patent: Nov. 19, 2019

(54) COLORED PHOTOSENSITIVE RESIN COMPOSITION AND LIGHT SHIELDING SPACER PREPARED THEREFROM

(71) Applicant: Rohm and Haas Electronic Materials Korea Ltd., Cheonan (KR)

(72) Inventors: Kyung-Jae Park, Hwaseong (KR); Ji Ung Kim, Hwaseong (KR); Hyung-Tak Jeon, Hwaseong (KR)

(73) Assignee: Rohm and Haas Electronic Materials Korea Ltd., Seoul (KR)

( * ) Notice: Subject to any disclaimer, the term of this patent is extended or adjusted under 35 U.S.C. 154(b) by 0 days.

(21) Appl. No.: 15/786,751

(22) Filed: Oct. 18, 2017

(65) Prior Publication Data

US 2018/0143533 A1    May 24, 2018

(30) Foreign Application Priority Data

Nov. 18, 2016  (KR) .................. 10-2016-0154111

(51) Int. Cl.
| | | |
|---|---|---|
| *G03F 7/031* | (2006.01) | |
| *G02F 1/1339* | (2006.01) | |
| *G02F 1/1335* | (2006.01) | |
| *G03F 7/032* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *G03F 7/00* | (2006.01) | |
| *G03F 7/038* | (2006.01) | |
| *H01L 51/52* | (2006.01) | |

(52) U.S. Cl.
CPC .......... *G03F 7/031* (2013.01); *G02F 1/13394* (2013.01); *G02F 1/133512* (2013.01); *G03F 7/0007* (2013.01); *G03F 7/032* (2013.01); *G03F 7/038* (2013.01); *G03F 7/162* (2013.01); *G03F 7/168* (2013.01); *G03F 7/2002* (2013.01); *G03F 7/322* (2013.01); *G03F 7/40* (2013.01); *G02F 2001/13398* (2013.01); *H01L 51/5284* (2013.01)

(58) Field of Classification Search
CPC ........ G03F 7/0007; G03F 7/027; G03F 7/028; G03F 7/031; G03F 7/032; G03F 7/105; G02B 5/223; H01L 51/525; H01L 51/5284; G02F 1/133512; G02F 1/13394; G02F 2001/13398
USPC .......................... 430/7, 280.1; 349/110, 156
See application file for complete search history.

(56) References Cited

U.S. PATENT DOCUMENTS

| | | |
|---|---|---|
| 9,069,132 B2 | 6/2015 | Jung et al. |
| 9,316,906 B2 | 4/2016 | Shin et al. |

FOREIGN PATENT DOCUMENTS

| | | | |
|---|---|---|---|
| CN | 104238269 A | | 12/2014 |
| JP | 2014-137466 A | * | 7/2014 |
| JP | 2015045686 A | | 3/2015 |
| KR | 10-2009-0004647 A | | 1/2009 |
| KR | 10-2013-0124215 A | | 11/2013 |
| KR | 1020150134989 A | | 12/2015 |

OTHER PUBLICATIONS

Computer-generated translation of JP 2014-137466 (Jul. 2014). (Year: 2014).*

* cited by examiner

*Primary Examiner* — John A McPherson
(74) *Attorney, Agent, or Firm* — S. Matthew Cairns

(57) ABSTRACT

The present invention relates to a colored photosensitive resin composition and to a light shielding spacer prepared therefrom. The colored photosensitive resin composition comprises an oxime ester fluorene-based compound as a photopolymerization initiator in a small amount, which is capable of forming a cured film that is excellent in terms of such properties as sensitivity, elastic recovery rate, resolution, chemical resistance, exudation resistance, voltage holding ratio, and the like. Accordingly, a light shielding spacer prepared therefrom can be advantageously used for a liquid crystal display, an organic EL display, and the like.

9 Claims, 2 Drawing Sheets

[Fig. 1]
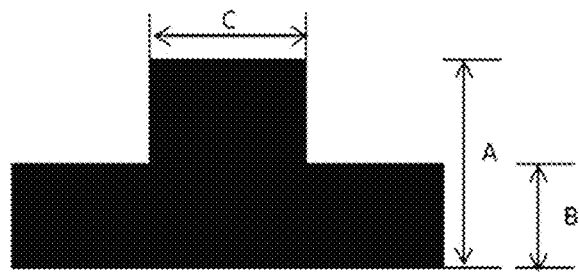
[Fig. 2]
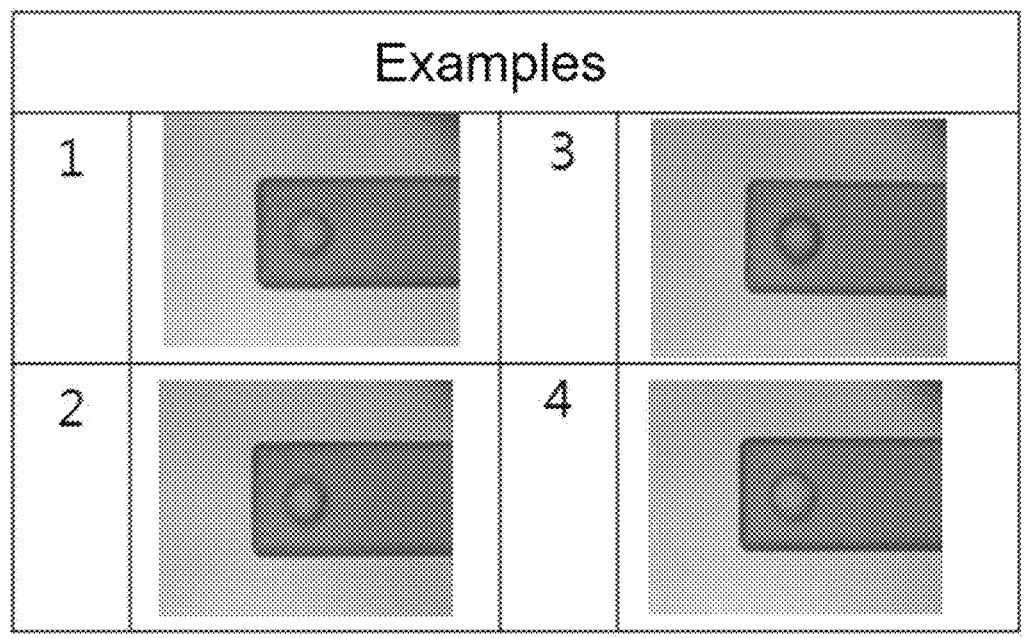

[Fig. 3]
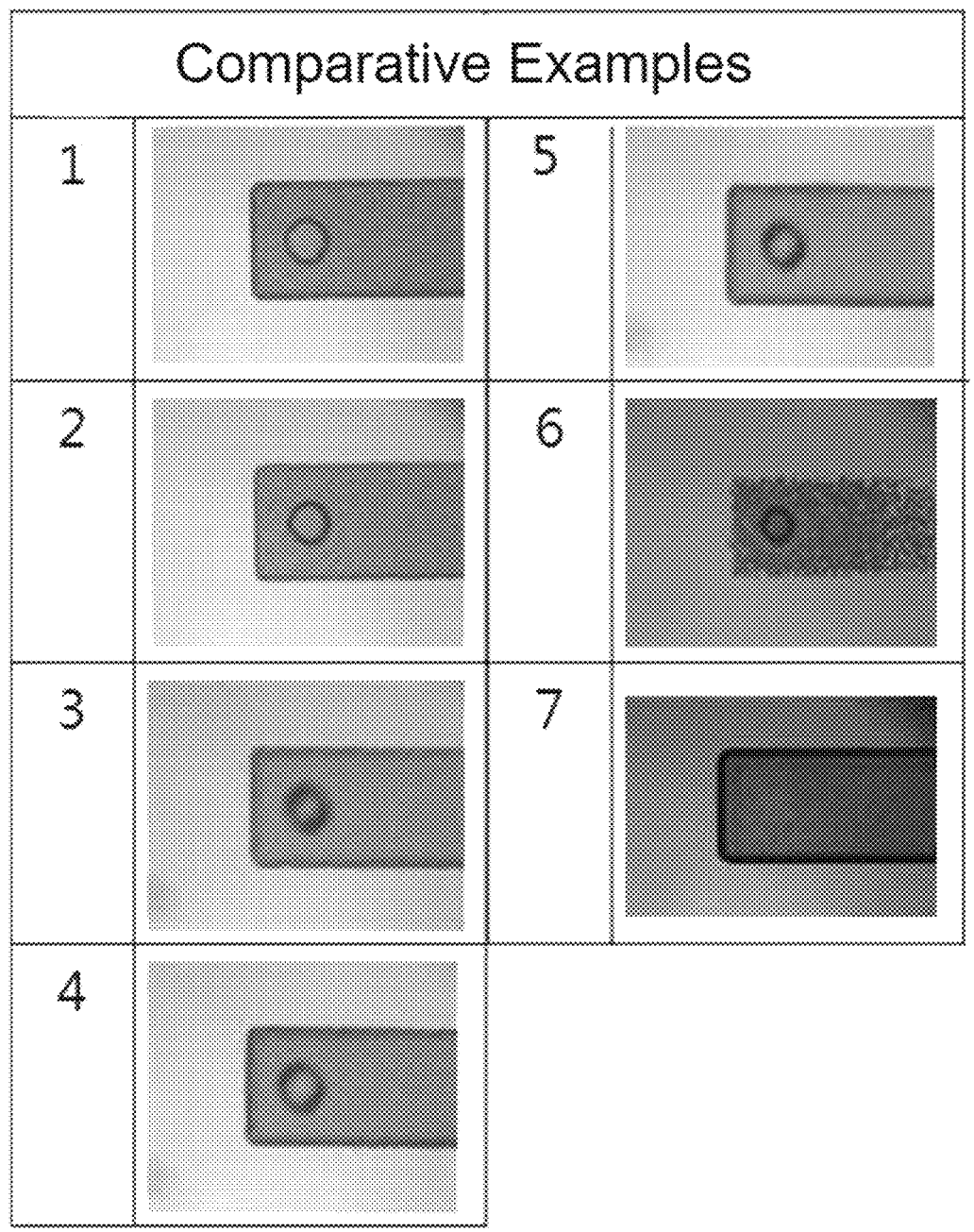

COLORED PHOTOSENSITIVE RESIN COMPOSITION AND LIGHT SHIELDING SPACER PREPARED THEREFROM

TECHNICAL FIELD

The present invention relates to a photosensitive resin composition capable of forming a cured film that is excellent in terms of voltage holding ratio, exudation resistance, development margin, and elastic recovery rate, and to a light shielding spacer prepared therefrom and used for a liquid crystal display, an organic EL display, and the like.

BACKGROUND ART

Recently, a spacer prepared from a photosensitive resin composition is employed in order to maintain a constant distance between the upper and lower transparent substrates in liquid crystal cells of a liquid crystal display (LCD). In an LCD, which is an electro-optical device driven by a voltage applied to a liquid crystal material injected into a constant gap between two transparent substrates, it is very critical to maintain the gap between the two substrates to be constant. If the gap between the transparent substrates is not constant, the voltage applied thereto as well as the transmittance of light penetrating this area may vary, resulting in a defect of spatially non-uniform luminance. According to a recent demand for large LCD panels, it is even more critical to maintain a constant gap between two transparent substrates in an LCD.

Such a spacer may be prepared by coating a photosensitive resin composition onto a substrate and exposing the coated substrate to ultraviolet light, etc., using a mask, followed by development thereof. Recently, efforts of using a light shielding material for a spacer have been made; accordingly, various colored photosensitive resin compositions have been actively developed.

Recently, a black column spacer (BCS), i.e., a light shielding spacer, in which a column spacer and a black matrix are integrated into a single module using a colored photosensitive resin composition has been provided to simplify the process steps. Such a light shielding spacer is required to have high sensitivity and excellent development margin characteristics. A conventional light shielding spacer, however, has the defect that the voltage holding ratio (VHR) that may affect the driving of liquid crystals after the assembly of upper and lower display plates is low; or that color washout occurs, which may cause a poor transmission of electric signals, thereby hampering the reliability of the product.

In particular, a light shielding spacer prepared from a colored photosensitive resin composition, which contains a pigment by nature, has the problem that the voltage holding ratio is relatively low.

PRIOR ART DOCUMENT

Patent Document (Patent Document 1) Korean Laid-open Patent Publication No. 2013-0124215

DISCLOSURE OF INVENTION

Technical Problem

Accordingly, the present invention aims to provide a colored photosensitive resin composition comprising an oxime ester fluorene-based photopolymerization initiator in a smaller amount than conventional oxime ester-based photopolymerization initiators, which is capable of forming a cured film that is excellent in terms of such properties as sensitivity, elastic recovery rate, resolution, chemical resistance, exudation resistance, voltage holding ratio, and the like, and a light shielding spacer prepared therefrom.

Solution to Problem

In order to accomplish the above object, the present invention provides a colored photosensitive resin composition, which comprises: (A) a copolymer; (B) an epoxy resin or a compound derived therefrom; (C) a photopolymerizable compound; (D) a photopolymerization initiator; and (E) a colorant, wherein the photopolymerization initiator (D) comprises an oxime ester fluorene-based initiator of Formula 1 below:

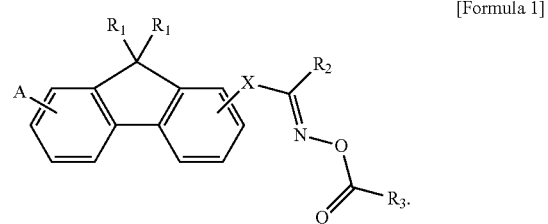

[Formula 1]

In Formula 1 above, $R_1$ is each independently $C_{1-20}$ alkyl,
$R_2$ and $R_3$ are each independently $C_{1-20}$ alkyl, $C_{6-20}$ aryl, or $C_{3-20}$ cycloalkyl,
A is nitro or cyano, and
X is a single bond or carbonyl.

In order to accomplish another object, the present invention provides a light shielding spacer prepared from the colored photosensitive resin composition.

Advantageous Effects of Invention

The colored photosensitive resin composition of the present invention comprises an oxime ester fluorene-based compound as a photopolymerization initiator in a small amount and is capable of forming a cured film that is excellent in terms of such properties as sensitivity, elastic recovery rate, resolution, chemical resistance, exudation resistance, voltage holding ratio, and the like. Accordingly, a light shielding spacer prepared therefrom can be advantageously used for a liquid crystal display, an organic EL display, and the like.

BRIEF DESCRIPTION OF THE DRAWINGS

FIG. 1 is a schematic diagram of an embodiment of the cross-section of a light shielding spacer (or a black column spacer).

FIGS. 2 and 3 are photographs of the light shielding spacers taken in the thickness direction for evaluating the presence or absence of a step difference in the light shielding spacers prepared from the compositions of the Examples and of the Comparative Examples.

BEST MODE FOR CARRYING OUT THE INVENTION

The colored photosensitive resin composition of the present invention comprises (A) a copolymer, (B) an epoxy resin or a compound derived therefrom, (C) a photopolymerizable compound, (D) a photopolymerization initiator, and (E) a colorant, and may further comprise (F) a surfactant and/or (G) a solvent, if desired.

In the present disclosure, "(meth)acryl" means "acryl" and/or "methacryl," and "(meth)acrylate" means "acrylate" and/or "methacrylate."

Hereinafter, each component of the colored photosensitive resin composition will be explained in detail.

(A) Copolymer

The copolymer used in the present invention may comprise (A-1) a structural unit derived from an ethylenically unsaturated carboxylic acid, an ethylenically unsaturated carboxylic anhydride, or a combination thereof and (A-2) a structural unit derived from an ethylenically unsaturated compound containing an aromatic ring, and may further comprise (A-3) a structural unit derived from an ethylenically unsaturated compound different from (A-1) and (A-2).

The copolymer is an alkali-soluble resin for developability in the development step and also plays the role of a base for forming a film upon coating and a structure for forming a final pattern.

(A-1) Structural Unit Derived from an Ethylenically Unsaturated Carboxylic Acid, an Ethylenically Unsaturated Carboxylic Anhydride, or a Combination Thereof In the present invention, the structural unit (A-1) is derived from an ethylenically unsaturated carboxylic acid, an ethylenically unsaturated carboxylic anhydride, or a combination thereof. The ethylenically unsaturated carboxylic acid or the ethylenically unsaturated carboxylic anhydride is a polymerizable unsaturated monomer containing at least one carboxyl group in the molecule. Particular examples thereof may include an unsaturated monocarboxylic acid such as (meth)acrylic acid, crotonic acid, alpha-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. The structural unit derived from the above exemplified compounds may be comprised in the copolymer alone or in combination of two or more.

The amount of the structural unit (A-1) may be 5 to 65 mole %, preferably 10 to 50 mole %, based on the total moles of the structural units constituting the copolymer. Within this range, developability may be more readily maintained.

(A-2) Structural Unit Derived from an Ethylenically Unsaturated Compound Containing an Aromatic Ring The structural unit (A-2) is derived from an ethylenically unsaturated compound containing an aromatic ring. Particular examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing halogen such as fluorostyrene, chlorostyrene, bromostyrene, and iodostyrene; styrene containing an alkoxy substituent such as methoxystyrene, ethoxystyrene, and propoxystyrene; 4-hydroxystyrene, p-hydroxy-α-methylstyrene, acetylstyrene; vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, and the like.

The structural unit derived from the above exemplified compounds may be comprised in the copolymer alone or in combination of two or more.

The styrene-based compounds among the above compounds may be preferable in consideration of polymerizability.

The amount of the structural unit (A-2) may be 2 to 70 mole %, preferably 5 to 60 mole %, based on the total moles of the structural units constituting the copolymer. Within this range, chemical resistance may be more favorable.

(A-3) Structural Unit Derived from an Ethylenically Unsaturated Compound Different from (A-1) and (A-2)

The copolymer used in the present invention may further comprise a structural unit derived from an ethylenically unsaturated compound different from (A-1) and (A-2) in addition to (A-1) and (A-2).

Particular examples of the structural unit derived from an ethylenically unsaturated compound different from (A-1) and (A-2) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an ethylenically unsaturated compound containing an epoxy group such as glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth) acrylate glycidyl ether, allyl glycidyl ether, and 2-methylallyl glycidyl ether; and an unsaturated imide such as N-phenylmaleimide, N-(4-chlorophenyl)maleimide, N-(4-hydroxyphenyl)maleimide, N-cyclohexylmaleimide, and the like.

The structural unit derived from the above exemplified compounds may be comprised in the copolymer alone or in combination of two or more.

Among these, a structural unit derived from an ethylenically unsaturated compound containing an epoxy group and/or an unsaturated imide, specifically glycidyl (meth)acrylate, 4-hydroxybutyl (meth)acrylate glycidyl ether, and/or N-substituted maleimide, may be more preferable in view of copolymerizability and improvement in the strength of an insulating film.

The amount of the structural unit (A-3) may be 10 to 80 mole %, preferably 20 to 75 mole %, based on the total moles of the structural units constituting the copolymer. Within this range, storage stability of a colored photosensitive resin composition may be maintained, and film retention rate may be more advantageously improved.

Examples of the copolymer having the structural units (A-1) to (A-3) may include a copolymer of (meth)acrylic acid/styrene, a copolymer of (meth)acrylic acid/benzyl (meth)acrylate, a copolymer of (meth)acrylic acid/styrene/methyl (meth)acrylate, a copolymer of (meth)acrylic acid/styrene/methyl (meth)acrylate/glycidyl (meth)acrylate, a copolymer of (meth)acrylic acid/styrene/methyl (meth)acrylate/glycidyl (meth)acrylate/N-phenylmaleimide, a copolymer of (meth)acrylic acid/styrene/methyl (meth)acrylate/glycidyl (meth)acrylate/N-cyclohexylmaleimide, a copolymer of (meth)acrylic acid/styrene/n-butyl (meth)acrylate/glycidyl (meth)acrylate/N-phenylmaleimide, a copolymer of (meth)acrylic acid/styrene/glycidyl (meth)acrylate/N-phenylmaleimide, a copolymer of (meth)acrylic acid/styrene/4-hydroxybutyl (meth)acrylate glycidyl ether/N-phenylmaleimide, and the like.

One, two, or more of the copolymers may be comprised in the colored photosensitive resin composition.

The weight average molecular weight (Mw) of the copolymer may be in the range of 10,000 to 20,000, preferably 15,000 to 18,000, when determined by gel permeation chromatography (eluent: tetrahydrofuran) referenced to polystyrene. Within this range, the step difference by a lower pattern may be advantageously improved, and a pattern profile after development may be favorable.

The copolymer may be employed in an amount of 5 to 40 wt %, preferably 10 to 30 wt %, based on the total weight of the solid content (i.e., the weight excluding solvents) of the colored photosensitive resin composition. Within this range, a pattern profile after development may be favorable, and such properties as film retention rate and chemical resistance may be improved.

The copolymer may be prepared by charging to a reactor a molecular weight modifier, a radical polymerization initiator, a solvent, and the structural units (A-1) to (A-3), as well as nitrogen thereto, followed by slowly stirring the mixture for polymerization.

The molecular weight modifier may be a mercaptan compound such as butylmercaptan, octylmercaptan, or the like, or a α-methylstyrene dimer, but is not particularly limited thereto.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but is not limited thereto. The radical polymerization initiator may be used alone or in combination of two or more.

Further, the solvent may be any conventional solvent commonly used in the preparation of a copolymer and may include, for example, propylene glycol monomethyl ether acetate (PGMEA).

(B) Epoxy Resin or a Compound Derived Therefrom

The colored photosensitive resin composition of the present invention comprises an epoxy resin or a compound derived therefrom.

Preferably, the epoxy resin or the compound derived therefrom may have a cardo backbone structure.

As a preferred example, the epoxy resin may be an epoxy resin compound having a cardo backbone structure as represented by Formula 2 below.

[Formula 2]

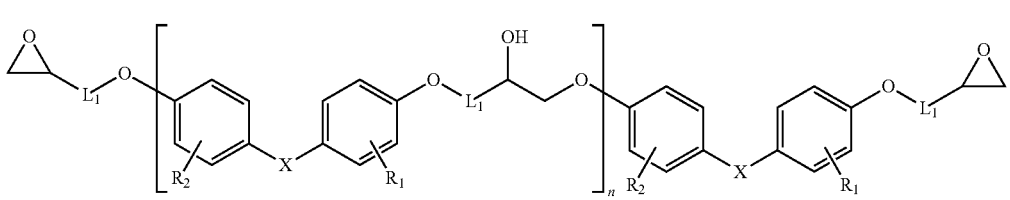

In Formula 2 above, X is each independently

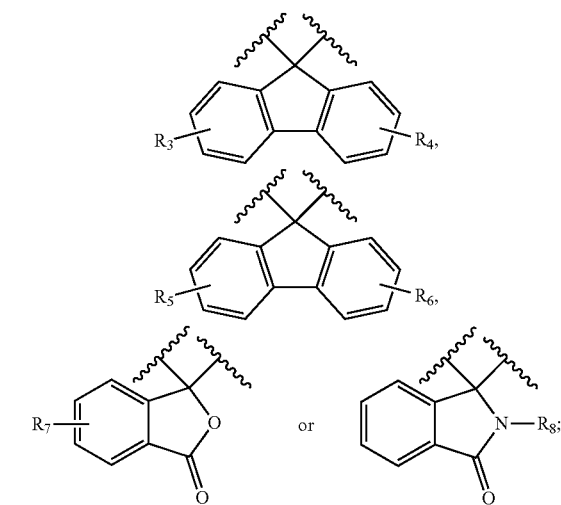

$L_1$ is each independently a $C_{1-10}$ alkylene group, a $C_{3-20}$ cycloalkylene group, or a $C_{1-10}$-alkyleneoxy group; $R_1$ to $R_7$ are each independently H, a $C_{1-10}$ alkyl group, a $C_{1-10}$ alkoxy group, a $C_{2-10}$ alkenyl group, or a $C_{6-14}$ aryl group; $R_8$ is H, methyl, ethyl, $CH_3CHCl-$, $CH_3CHOH-$, $CH_2=CHCH_2-$, or phenyl; and n is an integer from 0 to 10.

Particular examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, and the like. Particular examples of the $C_{3-20}$ cycloalkylene group may include cyclopropylene, cyclobutylene, cyclopentylene, cyclohexylene, cycloheptylene, decalinylene, adamantylene, and the like. Particular examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, and the like. Particular examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, and the like. Particular examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, and the like. Particular examples of the $C_{2-10}$ alkenyl group may include vinyl, allyl, butenyl, propenyl, and the like. Particular examples of the $C_{6-14}$ aryl group may include phenyl, tolyl, xylyl, naphthyl, and the like.

For example, the epoxy resin having a cardo backbone structure may be prepared through the following synthesis route:

[Reaction Scheme 1]

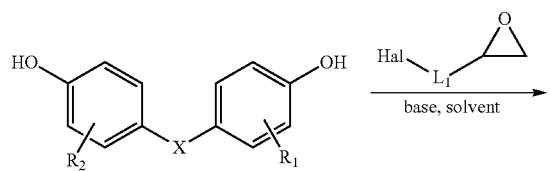

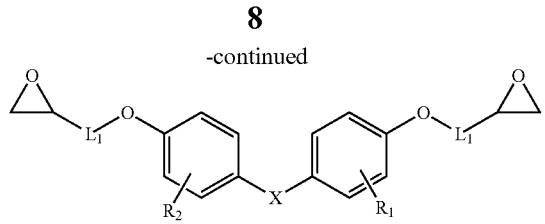

In Reaction Scheme 1 above, Hal is halogen; and X, $R_1$, $R_2$, and $L_1$ are the same as defined in Formula 2 above.

The compound derived from an epoxy resin having a cardo backbone structure may be obtained by reacting the epoxy resin having a cardo backbone structure with an unsaturated basic acid to produce an epoxy adduct and then reacting the epoxy adduct thus obtained with a polybasic acid anhydride, or by further reacting the product thus obtained with a monofunctional or polyfunctional epoxy compound. Any unsaturated basic acid known in the art, e.g., acrylic acid, methacrylic acid, crotonic acid, cinnamic acid, sorbic acid, and the like may be used. Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, and the like may be used. Any monofunctional or polyfunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, and the like may be used.

For example, the compound derived from an epoxy resin having a cardo backbone structure may be prepared through the following synthesis route:

[Reaction Scheme 2]

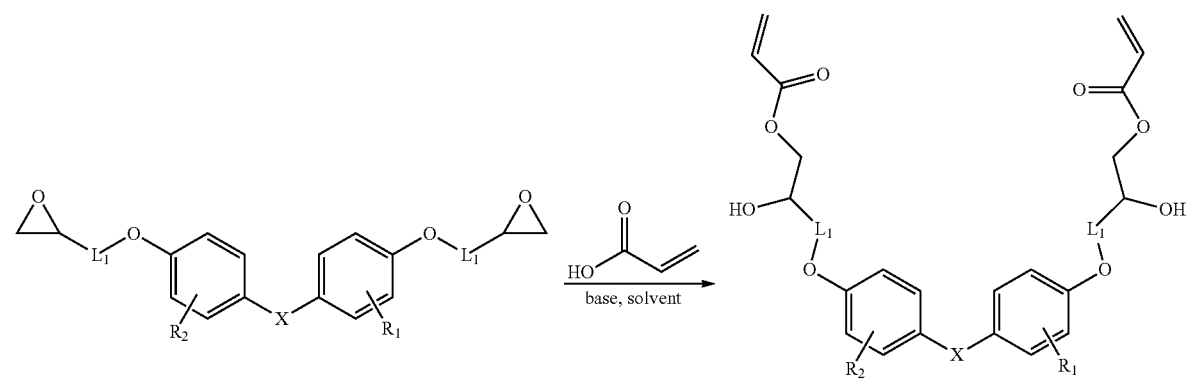

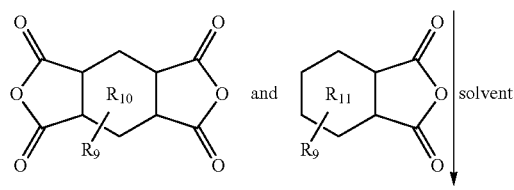

-continued

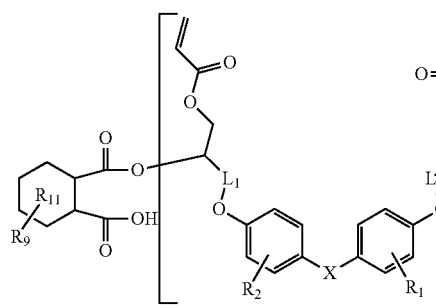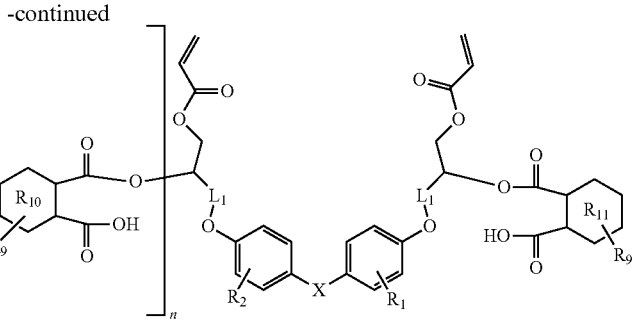

In Reaction Scheme 2 above, $R_9$ is each independently H, a $C_{1-10}$ alkyl group, a $C_{1-10}$ alkoxy group, a $C_{2-10}$ alkenyl group, or a $C_{6-14}$ aryl group; $R_{10}$ and $R_{11}$ are each independently a saturated or unsaturated $C_6$ aromatic or aliphatic ring; n is an integer from 1 to 10; and X, $R_1$, $R_2$, and $L_1$ are the same as defined in Formula 3.

When the epoxy resin having a cardo backbone structure or the compound derived therefrom is used, the cardo backbone structure may improve the adhesiveness between a cured material and a substrate, alkaline resistance, processability, strength, and the like. Further, an image with a fine resolution may be formed in a pattern once an uncured part is removed upon development.

The weight average molecular weight (Mw) of the epoxy resin or the compound derived therefrom may be in the range of 3,000 to 18,000, preferably 5,000 to 10,000, when determined by gel permeation chromatography (eluent: tetrahydrofuran) referenced to polystyrene. Within this range, the step difference by a lower pattern may be advantageously improved, and a pattern profile after development may be favorable.

The amount of the epoxy resin or the compound derived therefrom may be 5 to 30 wt %, preferably 10 to 25 wt %, based on the total weight of the solid content (i.e., the weight excluding solvents) of the colored photosensitive resin composition. Within this range, a pattern profile after development may be favorable, and such properties as chemical resistance and elastic restoring force may be improved.

(C) Photopolymerizable Compound

The photopolymerizable compound used in the present invention may be any compound that may be polymerized by the action of a polymerization initiator and may be a polyfunctional monomer, oligomer, or polymer commonly used in the preparation of a colored photosensitive resin composition.

More particularly, the photopolymerizable compound may include a monofunctional or polyfunctional ester compound having at least one ethylenically unsaturated double bond and may preferably be a polyfunctional compound having at least two functional groups in consideration of chemical resistance.

The polymerizable compound may be selected from the group consisting of ethylene glycol di(meth)acrylate, propylene glycol di(meth)acrylate, diethylene glycol di(meth) acrylate, triethylene glycol di(meth)acrylate, 1,6-hexanediol di(meth)acrylate, polyethylene glycol di(meth)acrylate, polypropylene glycol di(meth)acrylate, glycerin tri(meth) acrylate, trimethylolpropane tri(meth)acrylate, pentaerythritol tri(meth)acrylate, a monoester of pentaerythritol tri (meth)acrylate and succinic acid, pentaerythritol tetra(meth) acrylate, dipentaerythritol penta(meth)acrylate, dipentaerythritol hexa(meth)acrylate, a monoester of dipentaerythritol penta(meth)acrylate and succinic acid, caprolactone modified dipentaerythritol hexa(meth)acrylate, pentaerythritol triacrylate-hexamethylene diisocyanate (a reaction product of pentaerythritol triacrylate and hexamethylene diisocyanate), tripentaerythritol hepta(meth)acrylate, tripentaerythritol octa(meth)acrylate, bisphenol A epoxyacrylate, ethylene glycol monomethyl ether acrylate, and a mixture thereof, but is not limited thereto.

Examples of a commercially available polymerizable compound may include (i) monofunctional (meth)acrylate such as Aronix M-101, M-111, and M-114 manufactured by Toagosei Co., Ltd., KAYARAD T4-110S and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri and more functional (meth)acrylate such as Aronix M-309, M-400, M-403, M-405, M-450, M-7100, M-8030, M-8060, and TO-1382 manufactured by Toagosei Co., Ltd., KAYARAD TMPTA, DPHA, DPHA-40H, DPCA-20, DPCA-30, DPCA-60, and DPCA-120 manufactured by Nippon Kayaku Co., Ltd., and V-295, V-300, V-360, V-GPT, V-3PA, V-400, and V-802 manufactured by Osaka Yuki Kayaku Kogyo Co., Ltd.

The amount of the photopolymerizable compound is 10 to 40 wt %, preferably 15 to 25 wt %, based on the total weight of the solid content (i.e., the weight excluding solvents) of the colored photosensitive resin composition. Within this range, a pattern profile after development may be favorable, and such properties as chemical resistance and elastic restoring force may be improved. If the amount is less than 10 wt %, the development time may be prolonged, which may affect the process and residues. If the photopolymerizable compound is used in an amount exceeding 40 wt %, it may cause the problems of increased pattern resolution and surface wrinkles.

(D) Photopolymerization Initiator

The colored photosensitive resin composition of the present invention comprises an oxime ester fluorene-based initiator of Formula 1 below as a photopolymerization initiator:

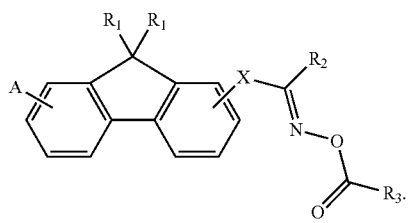

[Formula 1]

In Formula 1 above, $R_1$ is each independently $C_{1-20}$ alkyl, $R_2$ and $R_3$ are each independently $C_{1-20}$ alkyl, $C_{6-20}$ aryl, or $C_{3-20}$ cycloalkyl, A is nitro or cyano, and X is a single bond or carbonyl.

Preferably, $R_1$ is each independently methyl, ethyl, n-propyl, i-propyl, n-butyl, i-butyl, t-butyl, n-pentyl, i-pentyl, n-hexyl, or i-hexyl, and $R_2$ and $R_3$ are each independently methyl, ethyl, n-propyl, i-propyl, n-butyl, i-butyl, t-butyl, n-pentyl, i-pentyl, n-hexyl, i-hexyl, phenyl, naphthyl, biphenyl, terphenyl, anthryl, indenyl, or phenanthryl.

The oxime ester fluorene-based photopolymerization initiator may be synthesized according to a conventional method or may be purchased commercially.

The oxime ester fluorene-based photopolymerization initiator of Formula 1 serves as a crosslinking agent for a colored photosensitive resin composition, while it is capable of providing sufficient high sensitivity characteristics even when only a small amount is used and improving elastic recovery rate, resolution, chemical resistance, exudation resistance, and voltage holding ratio. Especially, since the colored photosensitive resin composition uses a colorant by nature, it is difficult to secure a sufficient voltage maintenance ratio required for driving (or aligning) liquid crystals. But the oxime ester fluorene-based photopolymerization initiator makes it possible to provide a high voltage holding ratio.

The colored photosensitive resin composition of the present invention may further comprise other photopolymerization initiators, which may be any known photopolymerization initiators.

The further photopolymerization initiators may be selected from the group consisting of an acetophenone compound, a non-imidazole compound, an onium salt compound, a benzoin compound, a benzophenone compound, a diketone compounds, an α-diketone compound, a polynuclear quinone compound, a thioxanthone compound, a diazo compound, an imidesulfonate compound, a carbazole compound, a sulfonium borate compound, and a mixture thereof.

The photopolymerization initiator may be used in an amount of 0.05 to 5 wt %, 0.1 to 5 wt %, 0.05 to 3 wt %, 0.05 to 1 wt %, 0.05 to 0.5 wt %, 0.05 to 0.2 wt % based on the total weight of the solid content (i.e., the weight excluding solvents) of the colored photosensitive resin composition. Within this range, a coated film with high sensitivity and excellent voltage holding ratio and exudation resistance may be obtained.

(E) Colorant

The colored photosensitive resin composition of the present invention comprises a colorant to impart the light shielding property thereto. The composition comprises the oxime ester fluorene-based photopolymerization initiator as described above, thereby preventing color washout that may otherwise occur due to the use of a colorant, which in turn improves the exudation resistance.

The colorant used in the present invention may be a mixture of two or more inorganic or organic colorants. It preferably has high chromogenicity and high heat resistance.

Especially, if two or more organic colorants are used together, it may be more advantageous to prevent light leakage of a black matrix and to secure a transmittance capable of mask alignment.

Further, the colorant may comprise a black colorant and a blue colorant, wherein the black colorant may be a black inorganic colorant and/or a black organic colorant.

According to an example, the colored photosensitive resin composition may comprise a black organic colorant as a colorant and, optionally, may further comprise a black inorganic colorant and a blue colorant.

The colorant may be at least one selected from the group consisting of a black inorganic colorant, a black organic colorant, and a blue colorant. For example, any compounds classified as a pigment in the Color Index (published by The Society of Dyers and Colourists) and any dyes known in the art may be used.

Particular examples of the black inorganic colorant may include carbon black, titanium black, a metal oxide such as Cu—Fe—Mn-based oxide and synthetic iron black, and the like. Preferred among them is carbon black for desirable pattern characteristics and chemical resistance.

Furthermore, particular examples of the black organic colorant may include aniline black, lactam black, perylene black, and the like. Preferred among them is lactam black (e.g., Black 582 from BASF) for desirable optical density (OD), dielectricity, and the like.

Particular examples of the blue colorant may include C.I. Pigment Blue 15:6, C.I. Pigment Blue 15:4, C.I. Pigment Blue 60, C.I. Pigment Blue 16, and the like. Preferred among them is C.I. Pigment Blue 15:6 for preventing light leakage.

The amount of the black inorganic colorant may be 0 to 20 wt %, preferably greater than 0 to 20 wt %, more preferably greater than 0 to 6 wt %, based on the total weight of the solid content (i.e., the weight excluding solvents) of the colored photosensitive resin composition.

The amount of the black organic colorant may be 10 to 40 wt % based on the total weight of the solid content (i.e., the weight excluding solvents) of the colored photosensitive resin composition.

The amount of the blue colorant may be 0 to 15 wt %, preferably 1 to 15 wt %, based on the total weight of the solid content (i.e., the weight excluding solvents) of the colored photosensitive resin composition.

The total amount of the colorants may be 10 to 75 wt %, preferably 20 to 60 wt % based on the total weight of the solid content (i.e., the weight excluding solvents) of the colored photosensitive resin composition. Within this range, a pattern profile after development may be favorable, and such properties as chemical resistance and elastic restoring force may be improved. If the amount is less than 20 wt % or exceeds 60 wt %, a desired optical density and transmittance may not be achieved.

Meanwhile, a dispersant may be used to disperse the colorant in the colored photosensitive resin composition of the present invention. Examples of the dispersant may include any known dispersant for a colorant. Particular examples thereof may include a cationic surfactant, an anionic surfactant, a non-ionic surfactant, a zwitterionic surfactant, a silicon surfactant, a fluorine surfactant, and the like. Commercially available dispersants may include Disperbyk-182, -183, -184, -185, -2000, -2150, -2155, -2163, and -2164 from BYK Co. These compounds may be used alone or in combination of two or more. The dispersant may be added in advance to a colorant through surface treatment of the colorant therewith or added together with a colorant at the time of preparing a colored photosensitive resin composition.

Further, the colorant may be mixed with a binder, which may then be used in the production of the colored photosensitive resin composition. The binder used herein may be the copolymer (A) described in the present invention, a known copolymer, or a mixture thereof.

Accordingly, the colorant used in the present invention may be added to the colored photosensitive resin composition in the form of a mill base as mixed with a dispersant, a binder, a solvent, or the like.

(F) Surfactant

The colored photosensitive resin composition of the present invention may further comprise a surfactant in order to improve coatability and to prevent generation of defects.

Although the kind of the surfactant is not particularly limited, for example, a fluorine-based surfactant or silicon-based surfactant may be used.

The commercially available silicon-based surfactant may include DC3PA, DC7PA, SH11PA, SH21PA, and SH8400 from Dow Corning Toray Silicon, TSF-4440, TSF-4300, TSF-4445, TSF-4446, TSF-4460, and TSF-4452 from GE Toshiba Silicone, BYK 333, BYK 307, BYK 3560, BYK UV 3535, BYK 361N, BYK 354, and BYK 399 from BYK, and the like. The surfactant may be used alone or in combination of two or more.

The commercially available fluorine-based surfactant may include Megaface F-470, F-471, F-475, F-482, F-489, and F-563 from DIC (Dainippon Ink Kagaku Kogyo Co.). Preferable surfactants among them may be BYK 333 and BYK 307 from BYK and F-563 from DIC in terms of coatability.

The amount of the surfactant may be 0.01 to 3 wt %, preferably 0.1 to 1 wt %, based on the total weight of the solid content (i.e., the weight excluding solvents) of the colored photosensitive resin composition. Within this range, the colored photosensitive resin composition may be smoothly coated.

(G) Solvent

The colored photosensitive resin composition of the present invention may preferably be prepared as a liquid composition in which the above components and a solvent are mixed. Any solvent known in the art, which is compatible but not reactive with the components in the colored photosensitive resin composition, may be used in the preparation of the colored photosensitive resin composition.

Examples of the solvent may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate and propylene glycol propyl ether acetate; and alkoxyalkyl acetates such as 3-methoxybutyl acetate. The solvent may be used alone or in combination of two or more.

The amount of the solvent may be 50 to 90 wt %, preferably 70 to 85 wt %, based on the total weight of the colored photosensitive resin composition. Within this range, the composition may be smoothly coated, and any delay margin that may otherwise occur during the process may be improved.

In addition, the colored photosensitive resin composition of the present invention may comprise other additives such as a silane coupling agent, an antioxidant, and a stabilizer as long as the physical properties of the colored photosensitive resin composition are not adversely affected.

Accordingly, the colored photosensitive resin composition as described above comprises an oxime ester fluorene-based compound as a photopolymerization initiator in a small amount, which is capable of forming a cured film that is excellent in terms of such properties as sensitivity, elastic recovery rate, resolution, chemical resistance, exudation resistance, voltage holding ratio, and the like. Accordingly, a light shielding spacer prepared therefrom can be advantageously used for a liquid crystal display, an organic EL display, and the like.

The colored photosensitive resin composition of the present invention comprising the above-described components may be prepared by a common method, for example, by the following method.

At first, a colorant is mixed with a solvent in advance and dispersed therein using a bead mill until the average particle diameter of the colorant reaches a desired value. At this time, a surfactant may be used, or a portion or the whole of a copolymer may be blended. Added to the dispersion thus obtained are the remainder of the copolymer and the surfactant, an epoxy resin or a compound derived therefrom, a photopolymerizable compound, and a photopolymerization initiator. An additive such as a silane coupling agent or an additional solvent, if necessary, may be further added to a certain concentration, followed by sufficiently stirring them to obtain a desired colored photosensitive resin composition.

The present invention also provides a light shielding spacer manufactured by curing the colored photosensitive resin composition. Preferably, the present invention provides a black column spacer (BCS) prepared from the colored photosensitive resin composition, wherein a column spacer and a black matrix are integrated into one module.

The light shielding spacer may have a voltage holding ratio of 85% or more, an optical density of 0.5 to 1.5/μm, and an elastic recovery rate of 90% or more.

The light shielding spacer may be manufactured through a coating formation step, a light exposure step, a development step, and a heat treatment step.

In the coating formation step, the colored photosensitive resin composition according to the present invention is coated on a pre-treated substrate by a spin coating method, a slit coating method, a roll coating method, a screen printing method, an applicator method, and the like in a desired thickness, for example 1 to 25 μm, which is then pre-cured at a temperature of 70 to 100° C. for 1 to 10 minutes to form a coating by removing the solvent therefrom.

In order to form a pattern on the coated film, a mask having a predetermined shape is placed thereon, and the coated film with the mask thereon is irradiated with an activated ray having 200 to 500 nm. Here, in order to manufacture an integrated-type black column spacer, a mask having patterns with different transmittances may be used to form a column spacer and a black matrix at the same time. As a light source used for the irradiation, a low-pressure mercury lamp, a high-pressure mercury lamp, an extra high-pressure mercury lamp, a metal halide lamp, an argon gas laser, and the like may be used; and X-ray, electronic ray, and the like may also be used, if desired. The amount of light exposure may vary depending on the kind and the compositional ratio of the components of the composition and the thickness of a dried coating. If a high-pressure mercury lamp is used, the amount of light exposure may be 500 mJ/cm$^2$ or less (at a wavelength of 365 nm).

After the light exposure step, a development step using an aqueous alkaline solution such as sodium carbonate, sodium hydroxide, potassium hydroxide, tetramethylammonium hydroxide, and the like as a developing solvent is performed to dissolve and remove the unnecessary portions, whereby only an exposed portion remains to form a pattern. An image pattern obtained by the development is cooled to room temperature and post-baked in a hot air circulation-type drying furnace at a temperature of 180 to 250° C. for 10 to 60 minutes to thereby obtain a final pattern.

The light shielding spacer thus produced may be used in the manufacture of electronic parts of an LCD, an OLED display, and the like, owing to its excellent properties. Thus, the present invention provides an electronic part comprising the light shielding spacer.

The LCD, OLED display, and the like may comprise other components known to those skilled in the art, except that they are provided with the light shielding spacer of the present invention. That is, an LCD, an OLED display, and the like, to which the light shielding spacer of the present invention can be applied, may fall within the scope of the present invention.

Hereinafter, the present invention will be described in more detail with reference to the following examples. However, these examples are set forth to illustrate the present invention, and the scope of the present invention is not limited thereto.

In the following examples, the weight average molecular weight is determined by gel permeation chromatography (GPC) using a polystyrene standard.

Synthesis Example 1: Preparation of a Copolymer (A)

To a 500 ml, round-bottomed flask equipped with a refluxing condenser and a stirrer, 100 g of a mixture consisting of 51 mole % of N-phenylmaleimide, 4 mole % of styrene, 10 mole % of 4-hydroxybutyl acrylate glycidyl ether, and 35 mole % of methacrylic acid, along with 300 g of propylene glycol monomethyl ether acetate (PGMEA) as a solvent and 2 g of 2,2'-azobis(2,4-dimethylvaleronitrile) as a radical polymerization initiator were charged. The mixture was then heated to 70° C. and stirred for 5 hours to obtain a copolymer having a solid content of 31 wt %. The copolymer thus prepared had an acid value of 100 mg KOH/g and a polystyrene-referenced weight average molecular weight (Mw) measured by gel permeation chromatography of 20,000.

TABLE 1

| | Monomers constituting the copolymer (mole %) | | | | |
| --- | --- | --- | --- | --- | --- |
| | N-phenyl-maleimide | Styrene | 4-Hydroxy-butyl acrylate glycidyl ether | Meth-acrylic acid | Weight average molecular weight (Mw) |
| Copolymer (A) | 51 | 4 | 10 | 35 | 20,000 |

Synthesis Example 2: Preparation of a Compound Derived from an Epoxy Resin (B)

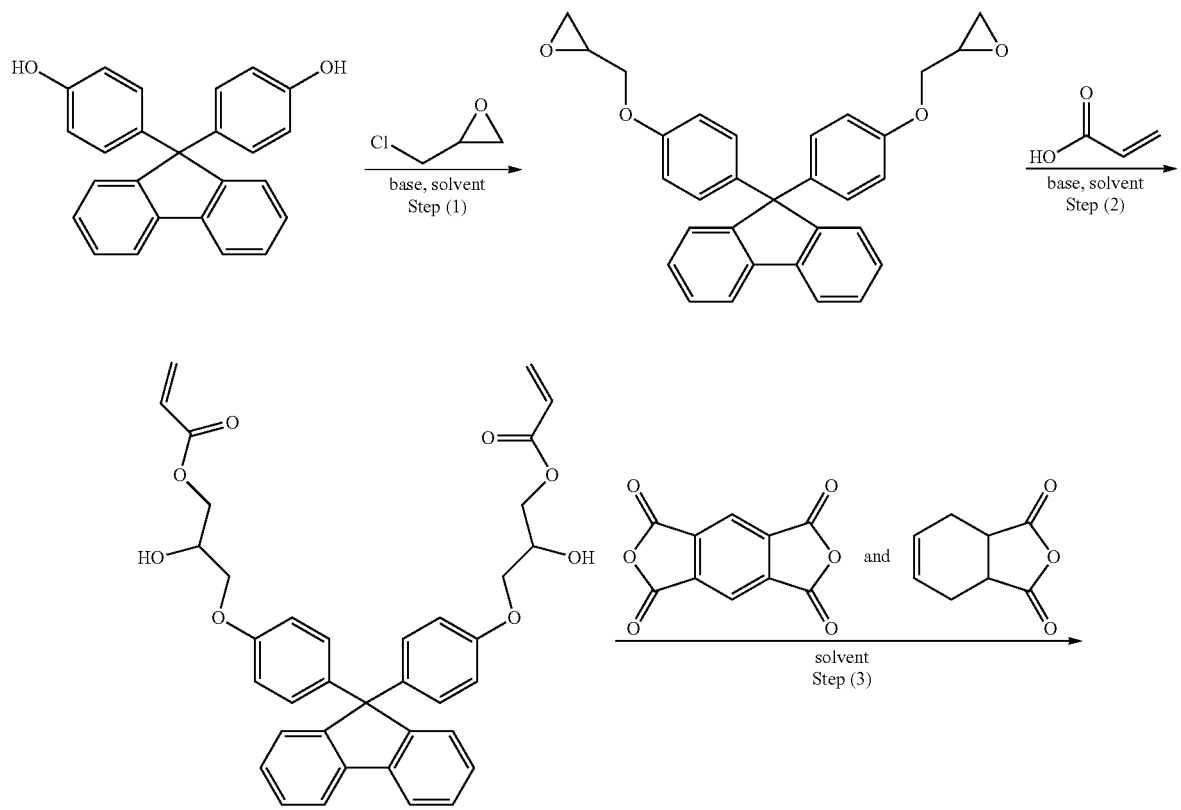

-continued

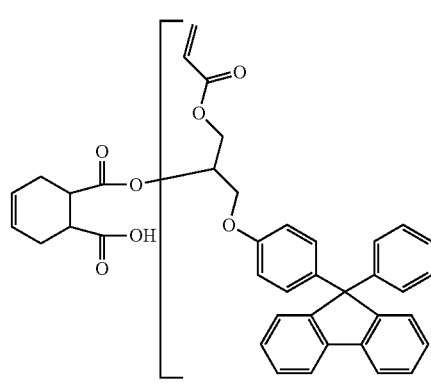
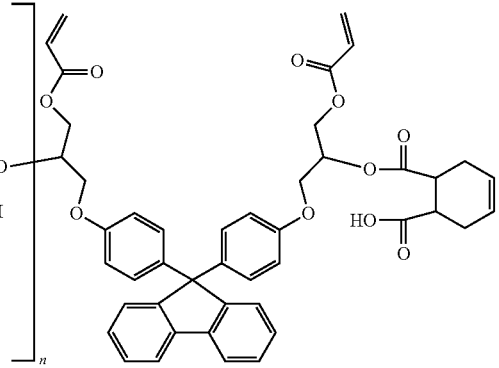

Step (1): Synthesis of 9,9-bis[4-(glycidyloxy)phenyl]fluorene

To a 3,000 ml, three-neck round-bottom flask, 200 g of toluene, 125.4 g of 4,4'-(9-fluorenylidene)diphenol, and 78.6 g of epichlorohydrin were charged, and they were heated to 40° C. with stirring to obtain a solution. 0.1386 g of t-butylammonium bromide and a 50% NaOH aqueous solution (3 eq.) were mixed in a separate vessel, and the mixture was slowly added to the flask in which the solution was being stirring.

The reaction mixture thus obtained was heated to 90° C. for 1 hour to completely consume 4,4'-(9-fluorenylidene) diphenol, which was confirmed by HPLC or TLC. The reaction mixture was cooled to 30° C., and 400 ml of dichloromethane and 300 ml of 1 N HCl were added thereto with stirring to separate an organic layer. The organic layer thus obtained was washed with 300 ml of distilled water twice or three times, dried over magnesium sulfate, and distilled under a reduced pressure to remove dichloromethane. The resultant was recrystallized using a mixture of dichloromethane and methanol to thereby obtain the title compound, an epoxy resin compound.

Step (2): Synthesis of (((9H-fluorene-9,9-diyl)bis(4,1-phenylene))bis(oxy))bis(2-hydroxypropane-3,1-diyl) Diacrylate (CAS No. 143182-97-2)

To a 1,000 ml, three-neck flask, 115 g of the compound obtained in step (1), 50 mg of tetramethylammonium chloride, 50 mg of 2,6-bis(1,1-dimethylethyl)-4-methylphenol, and 35 g of acrylic acid were charged. The mixture was heated to 90-100° C., while air was blown at a flow rate of 25 ml/min, and further heated to 120° C. to obtain a solution. The reaction mixture was continuously stirred for about 12 hours until its acid value dropped to less than 1.0 mg KOH/g and then cooled to room temperature. 300 ml of dichloromethane and 300 ml of distilled water were added to the reaction mixture with stirring to separate an organic layer. The organic layer thus obtained was washed with 300 ml of distilled water twice or three times, dried over magnesium sulfate, and distilled under a reduced pressure to remove dichloromethane to thereby obtain the title compound.

Step (3): Preparation of a Compound Derived from an Epoxy Resin and Having a Cardo Backbone Structure The compound obtained in step (2) was dissolved in PGMEA in a 1,000 ml, three-neck flask, and then 1,2,4,5-benzenetetracarboxylic acid dianhydride (0.75 eq.), 1,2,3,6-tetrahydrophthalic acid anhydride (0.5 eq.), and triphenylphosphine (0.01 eq.) were added thereto. The reaction mixture was heated to 120-130° C., stirred for 2 hours, and then cooled to 80-90° C., followed by stirring for 6 hours with heating. The reaction mixture was then cooled to room temperature to thereby obtain a solution (solid content of 49 wt %) of a polymer having an acid value of 107 mg KOH/g (based on the solid content) and a weight average molecular weight (Mw) of 6,000.

Synthesis Example 3: Preparation of a Colored Dispersion (E)

A colored dispersion (E) was supplied from Tokushiki Co., Ltd., which dispersion had been prepared as follows.

8 g of an acrylic copolymer solution having a weight average molecular weight of 12,000 to 20,000 g/mole and an acid value of 80 to 150 mg KOH/g (Tokushiki Co., Ltd.), 8 g of an acrylic polymer dispersant having an amine value of 100 to 140 mg KOH/g (Tokushiki Co., Ltd.), 18 g of carbon black, 65 g of lactam black (Black 582, BASF) as organic black, and 384 g of PGMEA as a solvent were dispersed using a paint shaker at 25° C. for 6 hours. This dispersing step was performed with 0.3 mm zirconia beads. Upon completion of the dispersing step, the beads were removed from the dispersion using a filter, thereby obtaining a colored dispersion having a solid content of 23 wt %.

Examples and Comparative Examples: Preparation of Photosensitive Resin Compositions The compounds prepared in the Preparation Examples above were used to prepare photosensitive resin compositions in the Examples and the Comparative Examples below.

In the Examples and the Comparative Examples, the following additional components were used.

TABLE 2

|  |  | Compound and/or brand name | Manufacturer | Solid content (wt %) |
|---|---|---|---|---|
| Photopolymerizable compound (C) |  | Dipentaerythritol hexaacrylate (DPHA) | Nippon Kayaku | 80 |
| Photopolymerization initiator (D) | D-1 | Oxime ester fluorene-based compound (SPI-02) | Samyang | 100 |
|  | D-2 | Oxime ester fluorene-based compound (SPI-03) | Samyang | 100 |
|  | D-3 | 1-[9-ethyl-6-(2-methylbenzoyl)-9H-carbazol-3-yl]ethanone-1-(O-acetyloxime) (OXE-02) | BASF | 100 |
|  | D-4 | N-1919 | Adeka | 100 |
|  | D-5 | 2-dimethylamino-2-(4-methyl-benzyl)-1-(4-morpholin-4-yl-phenyl)-butan-1-one (I-379) | BASF | 100 |
|  | D-6 | (E)-2-(4-styrylphenyl)-4,6-bis(trichloromethyl)-1,3,5-triazine (Triazine-Y) | Tronly | 100 |
| Colorant (E) | E-1 | Colored dispersion prepared in Synthesis Example 3 |  |  |
|  | E-2 | Carbon black (BK-0326) | TOKUSHIKI | 23 |
| Surfactant (F) |  | BYK-307 (BYK) | BYK | 100 |
| Solvent (G) |  | Propylene glycol monomethyl ether acetate (PGMEA) | Chemtronics | — |

Example 1: Preparation of a Colored Photosensitive Resin Composition (A) 3.0 g of the compound prepared as a copolymer in Synthesis Example 1, (B) 3.0 g of the compound prepared as a compound derived from an epoxy resin in Synthesis Example 2, (C) 1.8 g of DPHA as a photopolymerizable compound, (D) 0.03 g of SPI-2 as a photopolymerization initiator, (E) 9.80 g of the colored dispersion prepared as a colorant in Synthesis Example 3, and (F) 0.06 g of BYK-307 as a surfactant, based on the weight of solid content, were added to (G) PGMEA as a solvent to thereby obtain 30 g of a mixture. The mixture was then homogeneously mixed for 1 to thereby obtain a colored photosensitive resin composition.

Examples 2 to 4 and Comparative Examples 1 to 7: Preparation of Colored Photosensitive Resin Compositions Colored photosensitive resin compositions were prepared in the same manner as in Example 1, except that the types and/or the amounts of the photopolymerization initiator (D) were changed as shown in Table 3 below.

The numbers given in Table 3 below are based on 100 wt % of the resin composition.

Preparation of a Black Column Spacer (Light Shielding Spacer)

The colored photosensitive resin compositions obtained in the Examples and in Comparative Examples each were coated on a glass substrate using a spin coater and dried (or pre-baked) at 90° C. for 2.5 minutes to form a coated film. A pattern mask composed of a 100% full-tone column spacer (CS) pattern and a 30% half-tone black matrix pattern was applied on the coated film, which was then irradiated with light having a wavelength of 365 nm in the amount of light exposure of 30 to 80 mJ/cm². It was then developed with a 0.04 wt % aqueous solution of potassium hydroxide at 23° C. for 2 minutes, followed by washing with pure water for 1 minute to thereby form a pattern. The spacer with the pattern thus formed was cured (or post-baked) in an oven at 230° C. for 30 minutes to obtain a BCS with the final pattern.

Test Example 1: Measurement of Development Margin

A BCS having a thickness of 3.5 μm with a light shielding film thickness of 2 μm was prepared in the same manner as described above. The BCS thus prepared was developed for a development time of 10 to 20 seconds, and the change (or deviation) in the thickness of the light shielding film was observed to measure a development margin. When the

TABLE 3

| | | (wt %) | | | | | | | | | | |
|---|---|---|---|---|---|---|---|---|---|---|---|---|
| | | Comparative Examples | | | | | | | Examples | | | |
| | | 1 | 2 | 3 | 4 | 5 | 6 | 7 | 1 | 2 | 3 | 4 |
| Copolymer (A) | | 10 | 10 | 10 | 10 | 10 | 20 | 0 | 10 | 10 | 10 | 10 |
| Compound derived from an epoxy resin (B) | | 10 | 10 | 10 | 10 | 10 | 0 | 20 | 10 | 10 | 10 | 10 |
| Photopolymerizable compound (C) | | 6 | 6 | 6 | 6 | 6 | 6 | 6 | 6 | 6 | 6 | 6 |
| Colorant (E) | Synthesis Ex. 3 (E-1) | 33 | 33 | 33 | 33 | 33 | — | — | 33 | 33 | 33 | 33 |
| | Carbon black (E-2) | — | — | — | — | — | 33 | 33 | — | — | — | — |
| Surfactant (F) | | 0.1 | 0.1 | 0.1 | 0.1 | 0.1 | 0.1 | 0.1 | 0.1 | 0.1 | 0.1 | 0.1 |
| Photopolymerization initiator (D) | OXE-2 (D-3) | 0.3 | — | — | — | — | — | — | — | — | — | — |
| | N-1919 (D-4) | — | 0.4 | 0.27 | 0.23 | 0.13 | — | — | — | — | — | — |
| | I379 (D-5) | — | — | 0.03 | 0.3 | — | — | — | — | — | — | — |
| | Triazine-Y (D-6) | — | — | — | 0.07 | 0.07 | — | — | — | — | 0.07 | — |
| | SPI-02 (D-1) | — | — | — | — | — | 0.1 | 0.1 | 0.1 | 0.15 | 0.08 | — |
| | SPI-03 (D-2) | — | — | — | — | — | — | — | — | — | — | 0.2 |
| Solvent (G) | | Balance | | | | | | | | | | | measured value was 1,000 Å/second or less, the development margin of the shielding film was evaluated to be excellent.

Test Example 2: Measurement of Elasticity

A light shielding spacer having a thickness of 3.5 μm with a pattern width of 35 μm was prepared in the same manner as described above. The elastic recovery rate of the light shielding spacer was measured by the load/unload method using a FISCHERSCOPE (HM2000, Germany), in which a force of 500 mN was applied on the light shielding spacer with a plunger (50 μm plane plunger).

Test Example 3: Measurement of Voltage Holding Ratio (VHR)

The colored photosensitive resin composition was coated in the same manner as described above on a substrate on which an ITO (i.e., indium-tin oxide alloy) electrode had been deposited, wherein the resin composition formed a pattern having a thickness of 3.5 μm in the same shape as the electrode, from which a cell was fabricated. The voltage holding ratio of the cell was measured by applying a frequency of 1 V/60 Hz at 60° C. using a device for measuring a voltage holding ratio (Toyo-6254, Toyo).

Test Example 4: Measurement of Exudation Resistance

A substrate having a thickness of 3.5 μm, a width of 5 cm, and a length of 5 cm was prepared in the same manner as described above. The substrate thus prepared was immersed in 3 g of a 100% N-methylpyrrolidone (NMP) solution, which was then heated in a thermostat bath at 100° C. for 30 minutes. Once the substrate was removed, the NMP solution was subjected to liquid chromatography (HPLC) to determine the content of impurities in the NMP as exudation resistance. When the total amount of impurities was 30% or less, the exudation resistance was evaluated to be excellent.

Test Example 5: Measurement of Sensitivity

When the amount of exposure was split into a coated film upon pre-baking as prepared in the same manner as described above, the exposure amount at the point where the light shielding layer pattern of a BCS was obtained was measured, and the results are shown in Table 4 below. The sensitivity (mJ/cm$^2$) was evaluated to be faster as the amount of exposure required to form a light shielding layer was smaller.

Test Example 6: Measurement of Optical Density

A BCS having a thickness of 3.5 μm was prepared in the same manner as described above. The transmittance of the BCS thus prepared at 550 nm was measured using an optical density meter (361T, manufactured by Xlite), and the optical density based on a thickness of 1 μm was determined.

Test Example 7: Evaluation of Whether a Step Difference was Formed

The BCS of Test Example 1 was observed with an optical microscope (STM6, Olympus) in the thickness direction to see whether a black matrix and a spacer were visually distinguished. The results are shown in FIGS. 2 and 3 as photographs.

TABLE 4

|  | Comparative Examples | | | | | | | Examples | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Sensitivity (mJ/cm$^2$) | 55 | 60 | 75 | 60 | 60 | 45 | 45 | 45 | 35 | 45 | 50 |
| Elastic recovery rate (500 mN) | 87 | 85 | 84 | 85 | 86 | Not measurable | Not measurable | 91 | 92 | 93 | 90 |
| Exudation resistance (%) | 38.5 | 42.4 | 45.3 | 42.5 | 40.3 | 58.3 | 30 | 23.3 | 21.2 | 20.05 | 25.4 |
| Voltage holding ratio (%) | 83 | 80 | 80 | 80 | 80 | 65 | 65 | 90 | 90 | 90 | 88 |
| Development margin (□/sec) | 1340 | 1620 | 2120 | 1730 | 1980 | Not measurable | Not measurable | 700 | 620 | 850 | 950 |
| Optical density (/μm) | 1.2 | 1.2 | 1.2 | 1.2 | 1.2 | 1.5 | 1.5 | 1.2 | 1.2 | 1.2 | 1.2 |

As shown in FIGS. 2 and 3 and Table 5, the cured films (for examples, light shielding spacer or black column spacer) prepared from the compositions of the Examples, which fall within the scope of the present invention, were overall excellent in terms of sensitivity, elastic recovery rate, exudation resistance, voltage holding ratio, development margin, and optical density. Further, a step difference was clearly observed.

In contrast, the cured films prepared from the compositions according to the Comparative Examples, which do not fall within the scope of the present invention, showed unfavorable results in most of the properties. Further, a step difference was not clearly observed or not measurable.

REFERENCE NUMERALS OF THE DRAWINGS

A: thickness of the column spacer part
B: thickness of the black mattress part
C: Critical dimension (CD) of the column spacer part

The invention claimed is:
1. A colored photosensitive resin composition, which comprises:
(A) 5 to 40 wt % of a copolymer comprising (A-1) structural unit derived from an ethylenically unsaturated carboxylic acid, an ethylenically unsaturated carboxylic anhydride, or a combination thereof, (A-2) structural unit derived from an ethylenically unsaturated compound containing an aromatic ring, and (A-3) structural unit derived from an ethylenically unsaturated compound different from (A-1) and (A-2), based on the total weight of the solid content of the colored photosensitive resin composition;
(B) 5 to 30 wt % of an epoxy resin or a compound derived therefrom, based on the total weight of the solid content of the colored photosensitive resin composition;
(C) 10 to 40 wt % of a photopolymerizable compound, based on the total weight of the solid content of the colored photosensitive resin composition;
(D) 0.05 to 5 wt % of a photopolymerization initiator, based on the total weight of the solid content of the colored photosensitive resin composition; and
(E) 10 to 75 wt % of a colorant, based on the total weight of the solid content of the colored photosensitive resin composition,
wherein the photopolymerization initiator (D) comprises an oxime ester fluorene-based initiator of Formula 1 below:

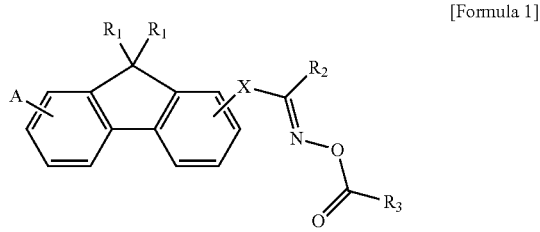

[Formula 1]

wherein, in Formula 1 above, R1 is each independently C1-20 alkyl, R2 and R3 are each independently C1-20 alkyl, C6-20 aryl, or C3-20 cycloalkyl, A is nitro or cyano, and
X is a single bond or carbonyl.

2. The colored photosensitive resin composition according to claim 1, wherein R1 is each independently methyl, ethyl, n-propyl, i-propyl, n-butyl, i-butyl, t-butyl, n-pentyl, i-pentyl, n-hexyl, or i-hexyl,
R2 and R3 are each independently methyl, ethyl, n-propyl, i-propyl, n-butyl, i-butyl, t-butyl, n-pentyl, i-pentyl, n-hexyl, i-hexyl, phenyl, naphthyl, biphenyl, terphenyl, anthryl, indenyl, or phenanthryl.

3. The colored photosensitive resin composition according to claim 1, wherein the epoxy resin or the compound derived therefrom (B) has a cardo backbone structure.

4. The colored photosensitive resin composition according to claim 1, wherein the colorant is at least one selected from the group consisting of a black inorganic colorant, a black organic colorant, and a blue colorant.

5. The colored photosensitive resin composition according to claim 1, wherein the colorant comprises the black inorganic colorant in an amount of 0 to 20 wt %, the black organic colorant in an amount of 10 to 40 wt %, and the blue colorant in an amount of 0 to 15 wt % based on the total weight of the solid content of the colored photosensitive resin composition.

6. A light shielding spacer manufactured from the colored photosensitive resin composition according to claim 1.

7. The light shielding spacer according to claim 6, which has a voltage holding ratio of 85% or more.

8. The light shielding spacer according to claim 6, which has an optical density of 0.5 to 1.5/μm.

9. The light shielding spacer according to claim 6, which has an elastic recovery rate of 90% or more.

* * * * *